(12) United States Patent
Yamazaki

(10) Patent No.: US 6,667,517 B1
(45) Date of Patent: Dec. 23, 2003

(54) ELECTROOPTICAL DEVICE AND ELECTRONIC DEVICE

(75) Inventor: Yasushi Yamazaki, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 94 days.

(21) Appl. No.: 09/671,345

(22) Filed: Sep. 27, 2000

(30) Foreign Application Priority Data

Sep. 27, 1999 (JP) .......................... 11-273235
Mar. 10, 2000 (JP) ........................ 2000-067386

(51) Int. Cl.⁷ .................. H01L 27/01; H01L 21/00
(52) U.S. Cl. ................... 257/347; 257/345; 257/349; 438/149; 438/479
(58) Field of Search ..................... 257/59, 72, 347, 257/339, 342, 344, 345, 349, 611, 400, 402, 403; 250/332, 370.08, 370.14; 345/205, 206, 208, 209, 210; 438/149, 479, 517, 282, 298, 910

(56) References Cited

U.S. PATENT DOCUMENTS 5,578,865 A * 11/1996 Vu et al. .................. 257/611
5,989,945 A * 11/1999 Yudasaka et al. ......... 438/149
6,023,088 A * 2/2000 Son ......................... 257/347
6,066,860 A * 5/2000 Katayama et al. ........ 257/71
6,433,767 B1 * 8/2002 Murade .................... 345/92

FOREIGN PATENT DOCUMENTS

JP 07-193248 7/1995

OTHER PUBLICATIONS

Ben G. Streetman, "Solid State Electronic Device" pp 326–327, Prentice Hall.*

* cited by examiner

Primary Examiner—Steven Loke
Assistant Examiner—Donghee Kang
(74) Attorney, Agent, or Firm—Oliff & Berridge, PLC

(57) ABSTRACT

An electrooptical device including a semiconductor device which is formed in a semiconductor layer on an insulating layer in such a manner that floating substrate effects which are essential in a SOI structure is suppressed without reducing the aperture ratio. The thickness of a semiconductor layer in pixel areas is limited to a range equal to or less than 100 nm, p-channel transistors having less floating substrate effects are employed as pixel transistors, and recombination centers are produced by means of implantation of Ar ions, thereby avoiding accumulation of excess carriers, thereby realizing an electrooptical device in which floating substrate effects are suppressed without forming a body contact and which has a high aperture ratio and a low optically induced leakage current.

14 Claims, 7 Drawing Sheets

[FIG. 1]
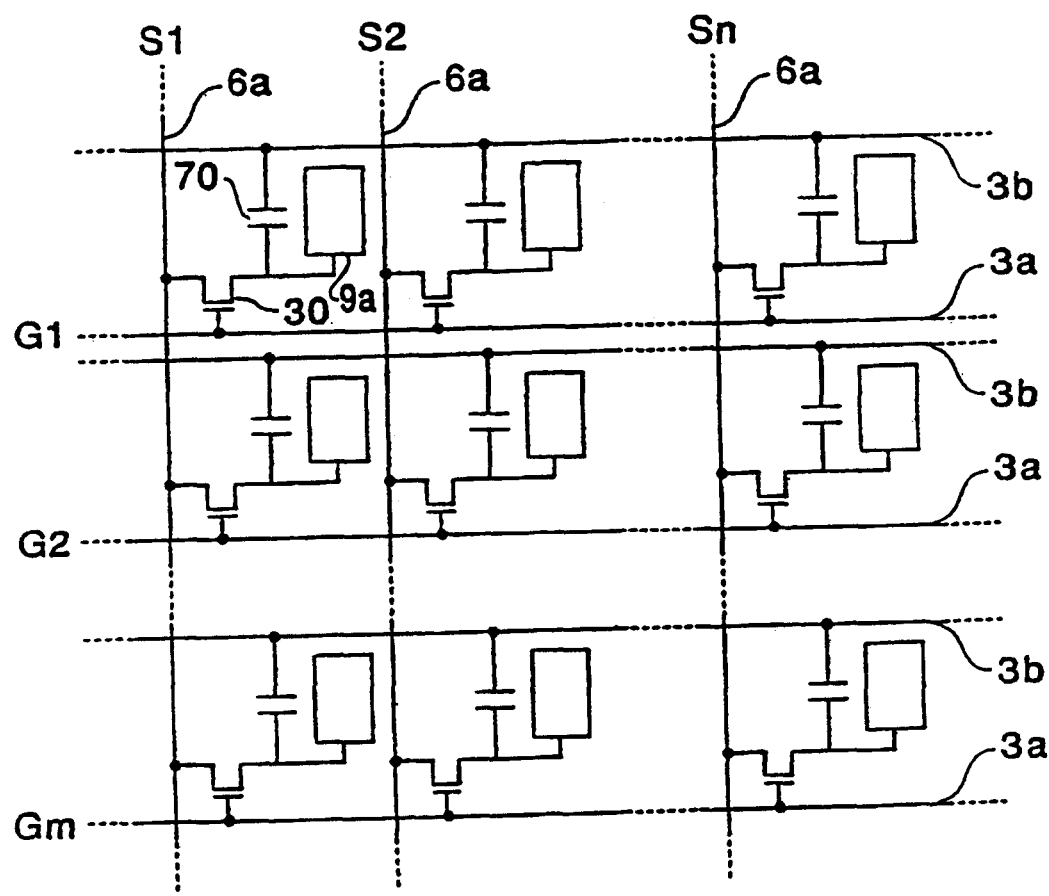

[FIG. 2]
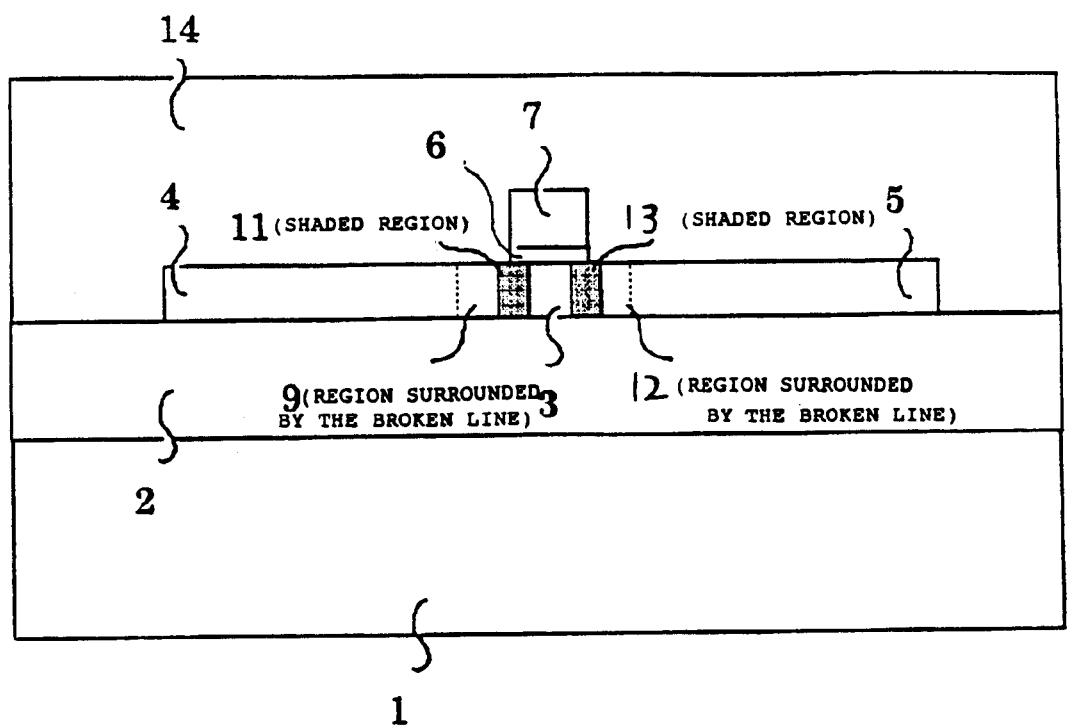

[FIG. 3]
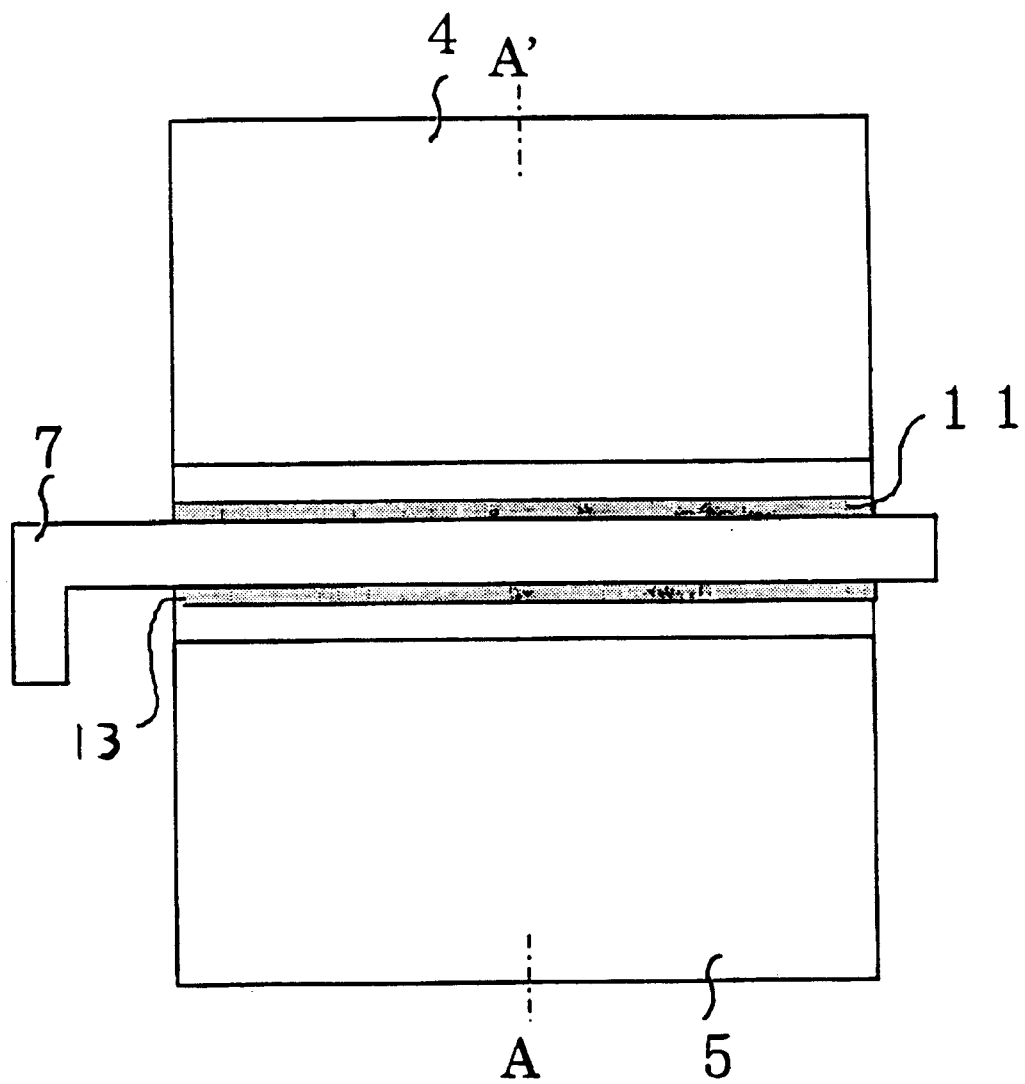

[FIG. 4]
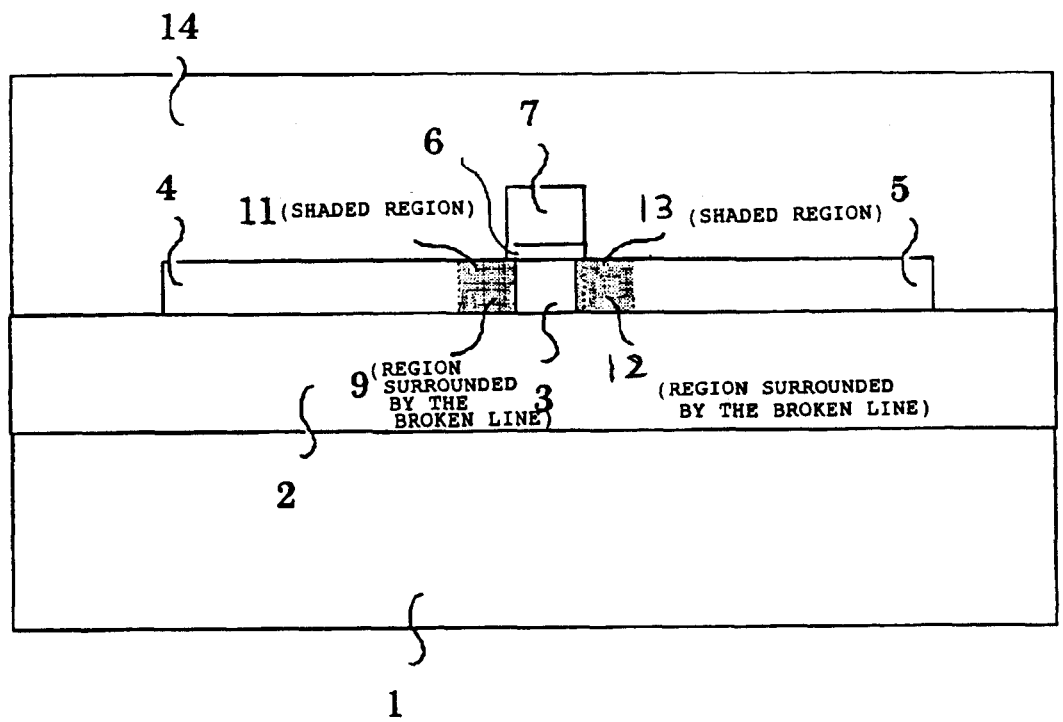
[FIG. 5]
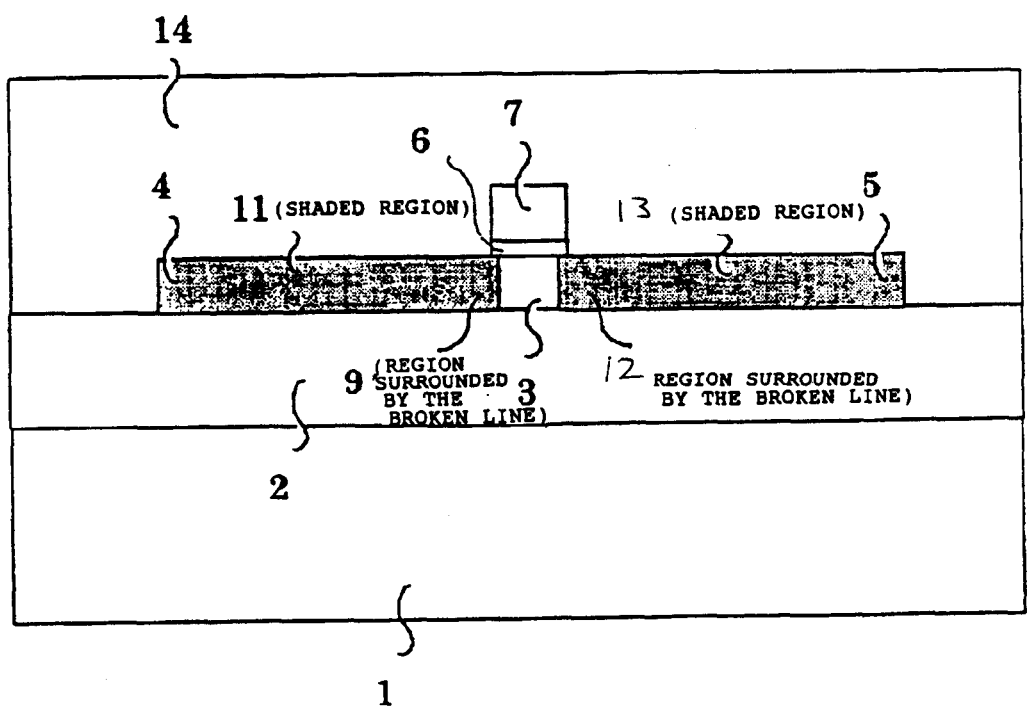

[FIG. 6]
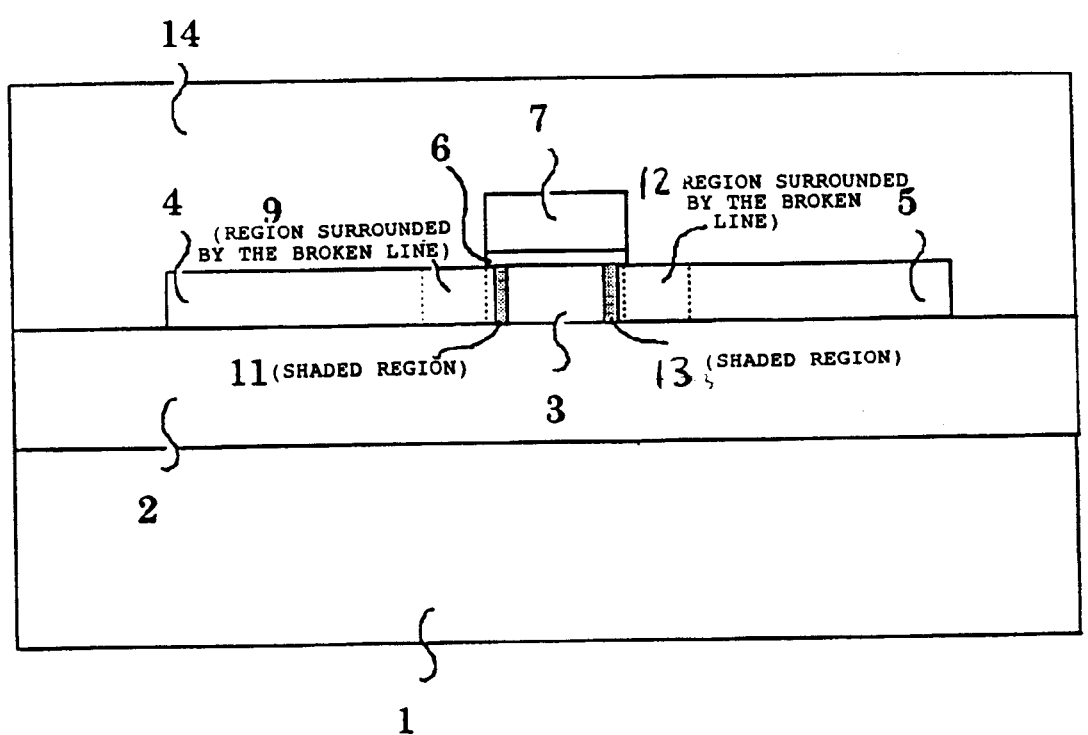

[FIG. 7]
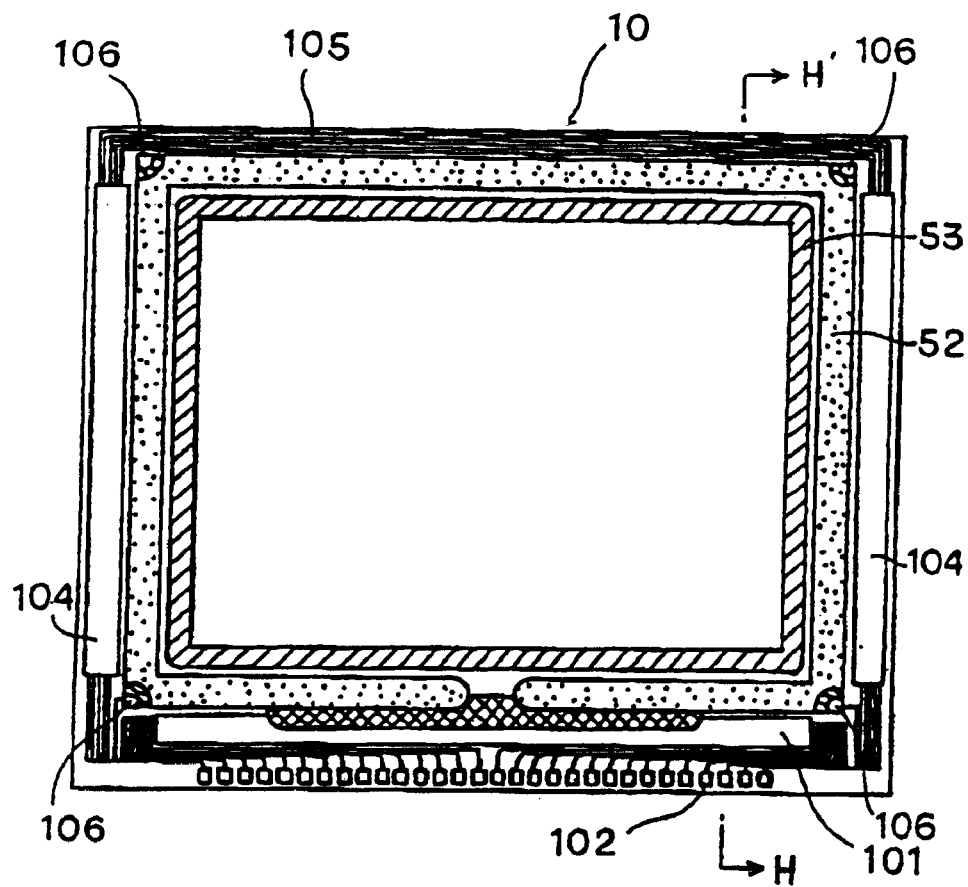
[FIG. 8]
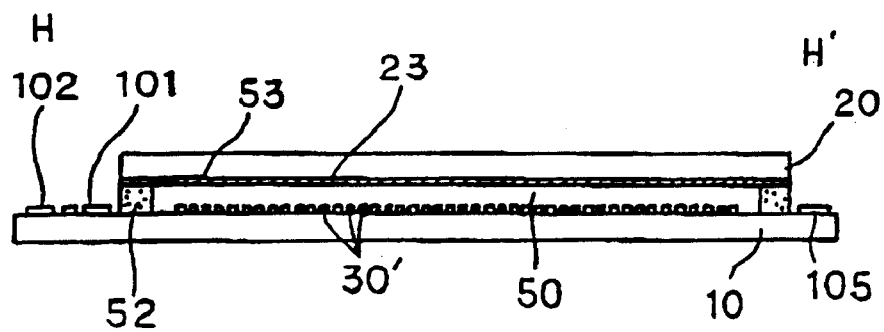

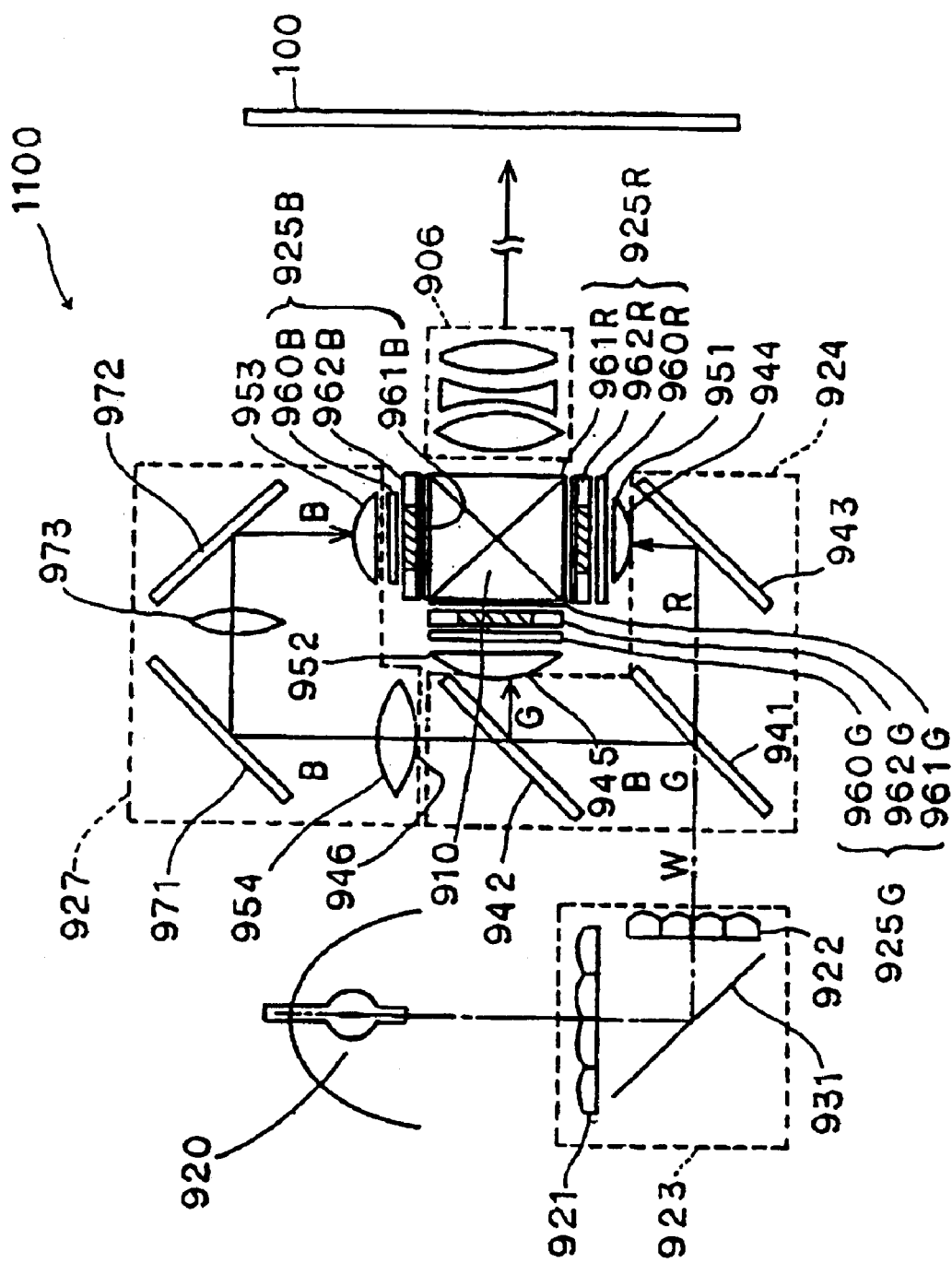
[FIG.9]

ELECTROOPTICAL DEVICE AND ELECTRONIC DEVICE

BACKGROUND OF THE INVENTION

1. Field of Invention

The present invention relates to an electrooptical device and an electronic device in which a MIS transistor is formed in a semiconductor layer on an insulating layer in such a manner as to avoid floating substrate effects.

2. Description of Related Art

The SOI (silicon on insulator) technology is used to form a semiconductor device such as a transistor using a semiconductor layer such as a single-crystal silicon layer formed on an insulating material. The semiconductor devices according to the SOI technology are advantageous in that they can operate at a high speed with low power consumption and in that a high integration density can be achieved. Thus, the semiconductor devices according to the SOI technology may be advantageously applied to electrooptical devices such as a liquid crystal device.

In the case of a MIS transistor in the form of a bulk semiconductor device, the channel region of the MIS transistor is generally fixed at a particular potential via a substrate on which the MIS transistor is formed. Therefore, no degradation occurs in electrical characteristics such as a reduction in the breakdown voltage due to extrinsic bipolar transistor effects caused by a change in the potential of the channel region.

However, in SOI-type MIS transistors, because the bottom of the channel is completely isolated by the underlying insulating film, the channel region is not fixed at a particular potential and is held in an electrically floating state. If excess carriers are generated by impact ionization which occurs when carriers accelerated by the electric field near the drain region collide with the crystal lattice, the excess carriers accumulate in the bottom part of the channel. The excess carriers accumulated in the bottom part of the channel result in an increase in the potential of the channel. As a result, the NPN structure (in the case of the n-channel transistor) including the source, the channel, and the drain acts as an extrinsic bipolar device, which causes an abnormal current to flow. Thus, degradation in the electrical characteristics such as a reduction in the breakdown voltage occurs. These phenomena caused by the electrically floating channel are called floating substrate effects.

One known technique to avoid the above problems due to the floating substrate effects is to form a body contact region electrically connected to the channel region via a particular path, thereby removing the excess carriers from the channel region, so as to suppress the floating substrate effect.

However, if a body contact region is formed in a MIS transistor used in a pixel area of an electrooptical device such as a liquid crystal device, the body contact region makes it difficult to produce pixels with a high density. In particular, in the case of a transmissive electrooptical device, the body contact region results in a reduction in the aperture ratio. Also, in the case where a body contact region is formed in a peripheral driving circuit in an area other than the pixel region, the body contact region results in a reduction in the integration density. In electrooptical devices used in electronic devices such as a projection-type display device, when high-intensity light is incident on pixels, carriers are generated by optical excitation. This causes a loss in the charge stored in pixel storage capacitors. As a result, nonuniformity such as flicker occurs in a displayed image.

In view of the above, it is an object of the present invention to provide an electrooptical device having a transistor in which floating substrate effects peculiar to SOI are suppressed, particularly for use in an electronic device in which the problem of leak current induced by optical excitation is notable, e.g., a projection-type display device, as well as an electronic device incorporating such an electrooptical device.

SUMMARY OF THE INVENTION

In order to achieve the above objects, the present invention provides a semiconductor device formed in a semiconductor layer on an insulating layer according to various aspects as described below.

According to a first aspect of the present invention, there is provided an electrooptical device comprising a substrate including a base substrate, a first insulating layer formed on the base substrate, and a semiconductor layer formed on the first insulating layer, the electrooptical device further comprising the following elements formed on the substrate: a plurality of scanning lines, a plurality of data lines extending so as to cross the plurality of scanning lines; pixel transistors each connected to one of the plurality of scanning lines and also to one of the plurality of data lines; pixel electrodes connected to the respective pixel transistors; and a peripheral circuit including a driving transistor for driving the pixel transistors, the electrooptical device including a pixel transistor or a driving transistor in which at least either a region including the boundary between a channel region and a source region or a region including the boundary between the channel region and a drain region has a defect density higher than that of the channel region.

In the pixel transistors or the driving transistor according to the first aspect of the present invention, the defects in the region with the higher defect density than the channel region acts as a carrier recombination center. As a result, accumulation of excess carriers is prevented and the floating substrate effects are suppressed.

According to a second aspect of the present invention, there is provided an electrooptical device comprising a substrate including a base substrate, a first insulating layer formed on the base substrate, and a semiconductor layer formed on the first insulating layer, the electrooptical device further comprising the following elements formed on the substrate: a plurality of scanning lines, a plurality of data lines extending so as to cross the plurality of scanning lines; pixel transistors each connected to one of the plurality of scanning lines and also to one of the plurality of data lines; and pixel electrodes connected to the respective pixel transistors, the pixel transistors being formed such that at least either a region including the boundary between a channel region and a source region or a region including the boundary between the channel region and a drain region has a defect density higher than that of the channel region.

In the pixel transistors according to the second aspect of the present invention, the defects in the region with the higher defect density than the channel region acts as a carrier recombination center, which prevent accumulation of excess carriers, thereby allowing the floating substrate effects to be suppressed without forming a body contact. Thus, it is possible to achieve an electrooptical device with a high aperture ratio.

According to a third aspect of the present invention, there is provided an electrooptical device comprising a substrate including a base substrate, a first insulating layer formed on the base substrate, and a semiconductor layer formed on the first insulating layer, the electrooptical device further comprising the following elements formed on the substrate: a plurality of scanning lines, a plurality of data lines extending so as to cross the plurality of scanning lines; pixel transistors each connected to one of the plurality of scanning lines and also to one of the plurality of data lines; pixel electrodes connected to the respective pixel transistors; and a peripheral circuit including a driving transistor for driving the pixel transistors, the pixel transistors or the driving transistor being formed such that at least either a region including the boundary between a channel region and a source region or a region including the boundary between the channel region and a drain region has a defect density higher than that of the channel region.

In the pixel transistors or the driving transistors according to the third aspect of the present invention, the defects in the region with the higher defect density than the channel region act as a carrier recombination center, which prevent accumulation of excess carriers, thereby allowing the floating substrate effects to be suppressed without forming a body contact. Thus, it is possible to achieve an electrooptical device with a great aperture ratio. Furthermore, it becomes possible to layout a peripheral circuit in a highly efficient fashion.

According to a fourth aspect of the present invention, there is provided an electrooptical device comprising a substrate including a base substrate, a first insulating layer formed on the base substrate, and a semiconductor layer formed on the first insulating layer, the electrooptical device further comprising the following elements formed on the substrate: a plurality of scanning lines, a plurality of data lines extending so as to cross the plurality of scanning lines; pixel transistors each connected to one of the plurality of scanning lines and also to one of the plurality of data lines; pixel electrodes connected to the respective pixel transistors; and a peripheral circuit including a driving transistor for driving the pixel transistors, the electrooptical device including a pixel transistor or a driving transistor in which at least a region extending toward a channel region from the boundary between the channel region and a source region or a region extending toward the channel region from the boundary between the channel and a drain region has a higher defect density than that of the channel region.

In the pixel transistors or the driving transistors according to the fourth aspects of the present invention, the defects in the region with the higher defect density than the channel region acts as a carrier recombination center. As a result, accumulation of excess carriers is prevented and the floating substrate effects are suppressed.

According to a fifth aspect of the present invention, there is provided an electrooptical device comprising a substrate including a base substrate, a first insulating layer formed on the base substrate, and a semiconductor layer formed on the first insulating layer, the electrooptical device further comprising the following elements formed on the substrate: a plurality of scanning lines, a plurality of data lines extending so as to cross the plurality of scanning lines; pixel transistors each connected to one of the plurality of scanning lines and also to one of the plurality of data lines; and pixel electrodes connected to the respective pixel transistors; the pixel transistors being formed such that at least a region extending toward a channel region from the boundary between the channel region and a source region or a region extending toward the channel region from the boundary between the channel and a drain region has a higher defect density than that of the channel region.

In the pixel transistors according to the fifth aspect of the present invention, the defects in the region with the higher defect density than the channel region acts as a carrier recombination center, which prevent accumulation of excess carriers, thereby allowing the floating substrate effects to be suppressed without forming a body contact. Thus, it is possible to achieve an electrooptical device with a high aperture ratio.

According to a sixth aspect of the present invention, there is provided an electrooptical device comprising a substrate including a base substrate, a first insulating layer formed on the base substrate, and a semiconductor layer formed on the first insulating layer, the electrooptical device further comprising the following elements formed on the substrate: a plurality of scanning lines, a plurality of data lines extending so as to cross the plurality of scanning lines; pixel transistors each connected to one of the plurality of scanning lines and also to one of the plurality of data lines; pixel electrodes connected to the respective pixel transistors; and a peripheral circuit including a driving transistor for driving the pixel transistors, the pixel transistors or the driving transistor being formed such that at least a region extending toward a channel region from the boundary between the channel region and a source region or a region extending toward the channel region from the boundary between the channel and a drain region has a higher defect density than that of the channel region.

In the pixel transistors according to the second aspect of the present invention, the defects in the region with the higher defect density than the channel region acts as a carrier recombination center, which prevent accumulation of excess carriers, thereby allowing the floating substrate effects to be suppressed without forming a body contact. Thus, it is possible to achieve an electrooptical device with a high aperture ratio. Furthermore, it becomes possible to layout a peripheral circuit in a highly efficient fashion.

In the electrooptical device according to any of the foregoing aspects of the present invention, the pixel transistors each connected to one of the plurality of scanning lines and also to one of the plurality of data lines are preferably p-channel transistors. In p-channel transistors, holes behaving as minority carriers have a smaller impact ionization coefficient than electrons. Therefore, p-channel transistors provide less floating substrate effects than n-channel transistors, and thus p-channel transistors can be driven with a higher voltage without using a body contact than n-channel transistors. Thus, by employing p-channel transistors as the pixel transistors, it becomes possible to achieve an electrooptical device having a greater aperture ratio. Furthermore, in the transistors each connected to one of the scanning lines and also connected to one of the data lines, the defects, which are produced in the particular regions having a higher defect density than the channel region acts as carrier a recombination center, thereby preventing excess carriers from accumulating. As a result, the floating substrate effects are suppressed. Thus, the transistors according to the present aspect of the invention are suitable for driving the liquid crystal or the like which requires a high driving voltage. Furthermore, in the described aspects of the invention, it is desirable that the semiconductor layer formed on the first insulating layer have a thickness equal to or less than 100 nm, at least at locations where the pixel transistors each connected to one of the plurality of scanning lines and also to one of the plurality of data lines are formed. That is, the small thickness of the semiconductor layer at locations where the pixel transistors each connected to one of the plurality of scanning lines and to one of the plurality of data lines are formed (that is, at locations which are illuminated with light) allows the leakage current due to optical excitation to be minimized.

In any of the foregoing aspects of the present invention, the defects in the high-defect-density regions are preferably produced by means of implantation of Ar ions so that the produced defects act as recombination centers.

In any of the foregoing aspects of the present invention, it is desirable that the base substrate is made of single-crystal silicon. This allows the electrooptical device to be applied to a reflective liquid crystal device or the like. Another advantage is that the electrooptical device can be produced simply by using production apparatus for bulk silicon devices.

In any of the foregoing aspects of the present invention, the base substrate may be made of quartz and the semiconductor layer on the first insulating layer may be made of single-crystal silicon. In this case, the base substrate is transparent, and thus the electrooptical device may be applied to a transmissive liquid crystal or the like. Another advantage is that a high-quality insulating film or the like can be formed and thus a high-reliability device can be realized using a high-temperature process which is not possible when the base substrate is made of glass. Furthermore, because the semiconductor layer is formed of single-crystal silicon, it becomes possible to realize a high-quality, high-precision electrooptical device capable of operating at a high driving frequency.

In any of the foregoing aspects of the present invention, the base substrate may be made of quartz and the semiconductor layer on the first insulating layer may be made of polycrystalline silicon. Also, in this case, the base substrate becomes transparent, and thus the electrooptical device may be applied to a transmissive liquid crystal or the like. Furthermore, a high-quality insulating film or the like can be formed and thus a high-reliability device can be realized using a high-temperature process which is not possible when the base substrate is made of glass. Furthermore, the semiconductor layer made of polycrystalline silicon has the advantage that it can be easily formed on a substrate, and thus a high-precision electrooptical device can be easily produced.

In any of the foregoing aspects of the present invention, the base substrate may be made of glass. In this case, because the base substrate is formed so as to be transparent using low-cost glass, it is possible to realize a transmissive electrooptical device such as a liquid crystal device at low cost.

According to still another aspect of the present invention, there is provided an electronic device comprising: a light source; an electrooptical device according to one of the aspects described above, for modulating light, which falls upon the electrooptical device after being emitted from the light source, in accordance with image information; and projection means for projecting the light modulated by the electrooptical device.

BRIEF DESCRIPTION OF THE DRAWINGS

FIG. 1 is a circuit diagram illustrating an equivalent circuit of an image display area of a liquid crystal device according to an embodiment of the present invention.

FIG. 2 is a cross-sectional view illustrating the structure of a transistor in the liquid crystal device.

FIG. 3 is a plan view illustrating the structure of the transistor in the liquid crystal device.

FIG. 4 is a cross-sectional view illustrating the structure of a transistor according to a first modification of the embodiment.

FIG. 5 is a cross-sectional view illustrating the structure of a transistor according to a second modification of the embodiment.

FIG. 6 is a cross-sectional view illustrating the structure of a transistor according to a third modification of the embodiment.

FIG. 7 is a plan view illustrating the structure of the liquid crystal device.

FIG. 8 is a cross-sectional view taken along line H–H' of FIG. 7.

FIG. 9 is a plan view illustrating the structure of a projection-type display device which is an example of an electronic device using the liquid crystal device according to the invention.

DETAILED DESCRIPTION OF PREFERRED EMBODIMENTS

The electrooptical device embodying the present invention is described in further detail below with reference to the accompanying drawings.

(Configuration of Electrooptical Device)

FIG. 1 illustrates an equivalent circuit of an image display area of a liquid crystal device which is an example of the electrooptical device according to an embodiment of the present invention. FIG. 3 is a plan view illustrating an example of a transistor structure used in the liquid crystal device. FIG. 2 is a cross-sectional view taken along line A–A' of FIG. 3.

In FIG. 1, the liquid crystal device of the present embodiment includes a plurality of pixels disposed in the form of a matrix in an image display area. Each pixel includes a pixel electrode 9a and a pixel transistor 30 for controlling the pixel electrodes 9a. The source of each pixel transistor 30 is electrically connected to one of data lines 6a through which an image signal is supplied. Image signals S1, S2, . . . , Sn may be supplied to the data lines 6a in a line-sequential manner in the order of S1, S2, . . . , Sn, or may be supplied to a group of plurality of data lines 6a on a group-by-group basis.

The gate of each pixel transistor 30 is electrically connected to one of scanning lines 3a. Scanning signals G1, G2, . . . , Gm in the form of pulses are applied to the scanning lines 3a at predetermined intervals on a line-sequential basis. Each pixel electrode 9a is electrically connected to the drain of a corresponding pixel transistor 30. The image signals S1, S2, . . . , Sn supplied through the data lines 6a are written into the pixels by closing the pixel transistors 30 for a predetermined period of time at predetermined timing. The image signals S1, S2, . . . , Sn written into the liquid crystal via the pixel electrodes 9a are held between the pixel electrodes 9a and the corresponding counter electrodes (which will be described later) formed on a counter substrate (which will be described later) for a predetermined period of time. In order to prevent the image signals held between the electrodes from being lost, storage capacitors 70 are connected in parallel to corresponding liquid crystal capacitors formed between the respective pixel electrodes 9a and the counter electrodes. The storage capacitors 70 lead to an improvement in the image signal holding performance. Thus, it becomes possible to realize a liquid crystal device with a high contrast.

The cross-sectional structure of the transistors according to the present embodiment is described below with reference to FIG. 2. It is to be noted that FIG. 2 shows only a transistor, and other elements such as pixel electrodes 9a, data lines 6a, and storage capacitors 70 in FIG. 1 are omitted.

As shown in FIG. 2, a first insulating layer 2 is formed on a base substrate 1, and a p-channel transistor is formed on the first insulating layer 2. More specifically, a semiconductor layer is formed on the first insulating layer 2, and a n⁻-type channel region 3, a p⁺-type source region 4, and a p⁺-type drain region 5, are formed at predetermined locations in the semiconductor layer. A second insulating layer (gate insulating film) 6 and a gate electrode 7 are formed on the channel region 3, and a MIS transistor is formed together with the second insulating layer 6 and the gate electrode 7. Although not shown in FIG. 2, a light blocking layer is formed below the transistor and between the base substrate 1 and the first insulating layer 2. More specifically, the light blocking layer is formed in the image display area so that the transistors in the image display area are covered with the light blocking layer when seen from below.

The base substrate 1 may be made of any one of the following materials: single-crystal silicon, quartz, and glass. In the case where the base substrate 1 is made of single-crystal silicon, the structure may be applied to reflective electrooptical devices. In this case, the semiconductor layer is formed of single-crystal silicon. In the case where the base substrate 1 is made of quartz or glass, the structure may be applied to transmissive electrooptical devices. In this case, the semiconductor layer may be formed of either single-crystal silicon or polycrystalline silicon.

Furthermore, an interlayer insulating film 14 is formed such that the semiconductor layer and the gate electrode 7 are covered with the interlayer insulating film 14. Although not shown in FIG. 2, each of the data lines 6a shown in FIG. 1 is formed such that it is connected to the source region 4 via a contact hole formed in the interlayer insulating film 14, and each of the pixel electrodes 9a shown in FIG. 1 is formed such that it is connected to the drain region 5 via a contact hole formed in the interlayer insulating film 14.

Furthermore, as in common types of MIS transistors, a LDD (lightly doped drain) region 9 (left one of two regions surrounded by broken lines in FIG. 2) is formed between the channel region 3 and the source region 4 such that the LDD region 9 provides a p-type semiconductor whose impurity concentration is lower than that of the source region 4. Similarly, a LDD (lightly doped drain) region 12 (right one of the two regions surrounded by broken lines in FIG. 2) is formed between the channel region 3 and the drain region 5 such that this LDD region 12 provides a p-type semiconductor whose impurity concentration is lower than that of the drain region 5. By forming the transistors so as to have the LDD stricture, the high electric field strength in the region near the drain is reduced, and thus impact ionization, which causes the floating substrate effects, can be suppressed. In p-channel transistors, holes behaving as minority carriers have a smaller impact ionization coefficient than electrons. Therefore, p-channel transistors produce less floating substrate effects than n-channel transistors, and thus p-channel transistors can be driven with a higher voltage without using a body contact than n-channel transistors. Thus, by employing p-channel transistors as the pixel transistors 30, it becomes possible to achieve an electrooptical device having a greater aperture ratio.

Ar ions are implanted in a region 11 (left one of two halftone regions in FIG. 2) extending a predetermined distance across the boundary between the channel region 3 and the source region 4 so that this region 11 has a higher defect density than the channel region 3. Similarly, Ar ions are also implanted in a region 13 (right one of the two halftone regions in FIG. 2) extending a predetermined distance across the boundary between the channel region 3 and the drain 5 so that this region 13 has a higher defect density than the channel region 3. As shown in FIG. 3, these regions 11 and 13 are formed over the entire width of the transistor along the gate electrode 7 on the sides of the source and drain regions 4 and 5, respectively.

The defects produced by implantation of Ar into the regions 11 and 13 act as recombination centers for excess carriers, and thus the floating substrate effects are further suppressed.

Because the source and the drain of the pixel transistors 30 work in place of each other, it is desirable that the regions 11 and 13 be formed on the sides of both the source and drain regions 4 and 5, respectively. For the same reason, it is desirable that the LDD regions 9 and 12 are formed at both locations on the sides of the source and drain regions 4 and 5. Although, in the present embodiment, device isolation is achieved by means of mesa isolation, any other device isolation technique such as LOCOS (local oxidation of silicon) or trench isolation may also be employed.

The increase in the breakdown voltage of the transistor according to the present embodiment can be achieved not only in the p-channel transistors but also in n-channel transistors. That is, the present embodiment may also be applied to n-channel transistors.

Furthermore, in the present embodiment, the transistor may be of the partial depletion type or the full depletion type. In the case of transistors of the partial depletion type, it is desirable that the semiconductor layer of the channel region 3 have a thickness in the range from 100 nm to 300 nm. On the other hand, in the case of transistors of the full depletion type, it is desirable that the semiconductor layer of the channel region 3 have a thickness in the range from 30 nm to 100 nm (typically 50 nm).

When the pixel transistors can be substantially perfectly shielded from light, the semiconductor layer of the pixel transistors may be so large that the transistors become of the partial depletion type, as long as a leakage current due to optical excitation falls within an allowable range.

When the pixel transistors 30 encounter leakage light due to imperfect light shield, it is desirable that the semiconductor layer of the channel region 3 have a thickness less than 100 nm so that the leakage current due to optical excitation is suppressed. The number of carriers generated by optical excitation increases in proportion to the thickness of the semiconductor layer. Therefore, the optically induced leakage current can be reduced by reducing the thickness of the semiconductor layer. However, a too small thickness of the semiconductor layer results in an increase in difficulty of controlling the threshold voltage of the transistors. Thus, a preferred thickness is about 50 nm. In some cases, a problem can occur as a result of the increase in sheet resistance due to the reduction in the thickness of the semiconductor layer. Such a problem can be solved by forming the source and drain using a silicide.

When a peripheral circuit including driving transistors for driving the pixel transistors 30 is formed in an area outside the image display area, the thickness of the semiconductor layer for the driving transistors in the peripheral circuit may or may not be less than 100 nm, although it is still desirable that the thickness of the semiconductor layer be equal to or less than 100 nm for the pixel transistors 30 in the image display area in which the optically induced leakage current should be minimized.

In the present embodiment, a body contact may be employed. That is, the floating substrate effects can be further suppressed by forming a body contact region electrically connected to the channel region via a particular path, thereby removing the excess carriers from the channel region.

(First Modification of the Embodiment)

A first modification of the embodiment is described below with reference to FIG. 4, wherein the description is limited to parts different from those in the embodiment described above, and the same parts are not described herein.

In this first modification, as can be seen from FIG. 4, the regions 11 and 13 (halftone regions in FIG. 4) having a higher defect density than the channel region 3 are formed in the same regions as the respective LDD regions 9 and 12 (regions surrounded by broken lines in FIG. 4). That is, in this first modification, Ar ions are implanted over the entire LDD regions 9 and 12. This technique prevents an increase in resistance of the source region 4 and the drain region 5.

(Second Modification of the Embodiment)

A second modification of the embodiment is described below with reference to FIG. 5, wherein the description is limited to parts different from those in the embodiment described above, and the same parts are not described herein.

In this second modification, as can be seen from FIG. 5, the region 11 is formed in the same region as that including the source region 4 and the LDD region 9, and the region 13 is formed in the same region as that including the drain region 5 and the LDD region 12. That is, Ar ions are implanted over the entire LDD regions 9 and 12 and the source and drain regions 4 and 5.

The advantage of the second modification is in that a mask used in the process of implanting the impurity into the LDD regions 9 and 12 may also be used in the process of implanting Ar ions into the regions 11 and 13. That is, Ar ions can be implanted in the same process as that for implanting the impurity into the LDD regions 9 and 12, and thus no additional process is required. In the case where Ar ions are implanted after activating the source region 4 and the drain region 5, a mask used to form the LDD regions 9 and 12 may also be used for the Ar ion implantation.

(Third Modification of the Embodiment)

A third modification of the embodiment is described below with reference to FIG. 6, wherein the description is limited to parts different from those in the embodiment described above, and the same parts are not described herein.

In this third modification, as can be seen from FIG. 6, the regions 11 and 13 are formed in particular regions within the channel region 3. That is, Ar ions are not implanted in any of the LDD regions 9 and 12 (regions surrounded by broken lines in FIG. 6), the source region 4, and the drain region 5.

This technique can minimize the leakage current due to the defects.

(Other Modifications)

In the case where the source region and the drain region are not replaced with each other, the region 11 having a higher defect density than the channel region 3 may be formed only in one of the source and drain regions. The LDD region 9 may be formed only on the side of the drain. In the present invention, the method of producing the regions 11 having a higher defect density than the channel region 3 is not limited to implantation of Ar ions. Other ions such as silicon, oxygen, carbon, or nitrogen ions may also be employed.

(General Structure of Liquid Crystal Device)

The general structure of an embodiment of a liquid crystal device is described below with reference to FIGS. 7 and 8. FIG. 7 is a plan view illustrating a device substrate 10, wherein various elements formed on the device substrate 10 seen from the side of an counter substrate 20 are shown. FIG. 8 is a cross-sectional view taken along line H–H' of FIG. 7, wherein the counter substrate 20 is also shown.

On the counter substrate 20, as shown in FIG. 7, a third light blocking film 53 serving as a frame made of the same as or different material from that of a second light blocking film 23 is disposed in an inner area along the sealing material 52. The second light blocking film 23 is formed over the areas other than the areas facing the respective pixel electrodes 9a so as to prevent light coming from the side of the counter substrate 20 from falling upon the pixel transistors and also to prevent different colors from being mixed among adjacent pixels.

In an area outside the sealing material 52, a data line driver circuit 101 and external connection terminals 102 are disposed along one side of the device substrate 10. Scanning line driver circuits 104 are disposed along two sides adjacent to the above-described side of the device substrate 10. Obviously, if a propagation delay of the scanning signal supplied to the scanning lines 3a is allowable, the scanning line driver circuit 104 may be disposed only on one side. The data line driver circuit 101 may be divided into two parts and they may be disposed at two sides of the image display area. For example, one data line driver circuit disposed along one side of the image display area may supply an image signal to odd-numbered data lines 6a, while the other data line driver circuit disposed along the opposite side of the image display area may supply an image signal to even-numbered data lines 6a. When the data lines 6a are driven in the comb fashion as described above, it is allowed to expand the area where the data line driver circuits are to be formed and thus it becomes possible to employ a complicated circuit configuration. A plurality of interconnection lines 105 extend along the remaining side on the device substrate 10 so that the two scanning line driver circuits disposed at two sides of the image display area are connected to each other via the interconnection lines 105. A vertical conducting element 106 is disposed on at least one corner of the counter substrate 20 so that the device substrate 10 and the counter substrate 20 are electrically connected via the vertical conducting element 106. The counter substrate 20 having an outer shape and size similar to those of the sealing material 52 is firmly fixed to the device substrate 10 via the sealing material 52, as shown in FIG. 8.

On the device substrate 10 of the liquid crystal device, there may also be formed a test circuit for evaluating and checking the quality and the defects of the liquid crystal device during the production process or before shipping it. The test circuit may be included in the peripheral circuit together with the data line driver circuit 101 and the scanning line driver circuit 104.

Instead of disposing the data line driver circuit 101 and the scanning line driver circuit 104 on the device substrate 10, they may be formed a driver LSI mounted on a TAB (tape automated bonding substrate) or the like and electrically and mechanically connected to the device substrate 10 via an anisotropic conducting film disposed outside the device substrate 10.

A polarizer film, an optical retardation film, and/or polarizing means are properly disposed on the side of the counter substrate 20 on which a projection light ray is incident and also on the side of the device substrate 10 from which the projection light ray emerges, depending on the operation mode such as a TN (twisted nematic) mode, an STN (super TN) mode, a D-STN (dual scan STN) mode, or normally white/black mode.

When the above-described liquid crystal device is used in a color liquid crystal projector, three similar liquid crystal devices are used as RGB light valves, respectively, wherein light rays with different colors created by passing a light ray through RGB color separation dichroic mirrors are passed through the respective liquid crystal panels. The resultant color light rays are combined together and projected. Therefore, in this case, no color filter is disposed on the counter substrate 20.

When the liquid crystal device according to the present embodiment is employed in a color liquid crystal device of a type other than the liquid crystal projector, such as a direct-view-type or reflection-type color liquid crystal television set, an RGB color filter with a protective film is formed on the counter substrate 20, in proper areas corresponding to the pixel electrodes 9a where the second light blocking film 23 is not formed.

When the liquid crystal device of the present embodiment is used as a light valve in a liquid crystal projector or the like, micro lenses may be formed on the counter substrate 20 at locations corresponding to the respective pixels so that the incident light rays are condensed in a more efficient fashion, thereby achieving a brighter liquid crystal device. Alternatively, an interference film including a large number of layers with different refractive index may be deposited on the counter substrate 20, thereby forming a dichroic filter for producing an RGB color utilizing interference of light. By adding the dichroic filter to the counter substrate, a still brighter color liquid crystal device can be achieved.

(Configuration of an Electronic Device)

As an example of an electronic device using the liquid crystal device according to the invention, a projection-type display device is described below with reference to FIG. 9. FIG. 9 illustrates the general structure of an optical system of a projection-type liquid crystal device 1100, in which three similar liquid crystal devices described above are used as RGB liquid crystal devices 962R, 962G, and 962B, respectively. The optical system of this projection-type display device 1100 includes a light source 920 and a uniformly illuminating optical system 923. The projection-type display device 1100 further includes: a color separation optical system 924 for separating light rays W received from the uniformly illuminating optical system 923 into three color light rays with colors of red (R), green (G), and blue (B), respectively; light valves 925R, 925G, and 925B for modulating the respective color light rays R, G, and B; a color mixing prism 910 for mixing the modulated color light rays; and a projection lens unit 906 serving as projection means for projecting the mixed color light rays onto a projection plane 100, thereby forming an enlarged image. The projection-type display device 1100 also includes a light guide system 927 for guiding the blue light ray B to the corresponding light valve 925B.

The uniformly illuminating optical system 923 includes two lens plates 921 and 922 and a reflective mirror 931, wherein the two lens plates 921 and 922 are disposed so as to be perpendicular to each other with respect to the reflective mirror 931. The two lens plates 921 and 922 of the uniformly illuminating optical system 923 each include a plurality of rectangular lenses which are disposed in the form of a matrix. The light rays emitted from the light source 920 are divided by the rectangular lenses of the first lens plate 921 into a plurality of sub light rays. These sub light rays are focused by the rectangular lenses of the second lens plate 922 so that the sub light rays are superimposed near the three light valves 925R, 925G, and 925B. That is, the uniformly illuminating optical system 923 allows the three light valves 925R, 925G, and 925B to be illuminated with uniform light, even if the intensity of light emitted from the light source 920 is not uniform in cross section.

The color separation optical system 924 includes a blue/green reflective dichroic mirror 941, a green reflective dichroic mirror 942, and a reflective mirror 943. A blue light ray B and a green light ray G contained in the light ray W are reflected by the blue/green reflective dichroic mirror 941 toward the green reflective dichroic mirror 942. On the other hand, the red light ray R is passed through the blue/green reflective dichroic mirror 941 and reflected at 90 degrees by the reflective mirror 943 located behind the blue/green reflective dichroic mirror 941. The reflected light ray R is output toward the color mixing optical system through a red light output element 944.

Of the blue and green light rays B and G reflected by the blue/green dichroic mirror 941, only the green light ray G is reflected at 90 degrees by the green reflective dichroic mirror 942. The reflected green light ray G is output toward the color mixing optical system via a green light output part 945. On the other hand, the blue light ray B is passed through the green reflective dichroic mirror 942 and is output toward the light guide system 927 via a blue light output element 946. In the present embodiment, the respective color light output parts 944, 945, and 946 are disposed at locations so that the distances from the light output part of the uniformly illuminating device are substantially equal to each other.

A condenser lens 951 is disposed on the outer side of the red light output part 944 through which the red light ray R is output from the color separation optical system 924, and a condenser lens 952 is disposed on the outer side of the green light output part 945 through which the green light ray G is output, so that the red light ray R and the green light ray G are collimated through the condenser lenses 951 and 952.

The collimated red and green light rays R and G are modulated through the light valves 925R and 925G thereby adding image information to the respective light rays R and G. That is, the liquid crystal devices of the respective light valves 925R and 925G are turned on and off by driving means (not shown) in accordance with image information thereby modulating the respective light rays passing through the light valves 925R and 925G.

On the other hand, the blue light ray B is led to the corresponding light valve 925B via the light guide 927 and is modulated in a similar manner in accordance with image information. In the present embodiment, the light valves 925R, 925G, and 925B are composed of input polarizer means 960R, 960G, and 960B, respectively, output polarizer means 961R, 961G, and 961B, respectively, and liquid crystal devices 962R, 962G, and 962B, respectively, disposed between the corresponding input and output polarizer means.

The light guide system 927 is formed of a condenser lens 954 disposed on the outer side of the output element 946 through which the blue light ray B is output, an input reflective mirror 971, an output reflective mirror 972, an intermediate lens 973 disposed between the two reflective mirrors 971 and 972, and a condenser lens 953 disposed in front of the light valve 925B. The blue light ray B output through the output part 946 is led to the liquid crystal device 962B via the light guide system 927 and is modulated by the liquid crystal device 962B. Of the optical lengths of the respective color light rays, that is, of the distances from the output part of the light ray W to the respective liquid crystals 962R, 962G, and 962B, the optical path of the blue light ray B is longest, and thus the blue light ray B encounters the greatest loss. The use of the light guide 927 allows the loss of the blue light ray B to be minimized.

The respective color light rays R, G, and B modulated via the light valves 925R, 925G, and 925B fall on the color mixing prism 910 and mixed into a single light ray. The resultant light ray output from the color mixing prism 910 is projected via a projection lens unit 906 onto a projection plane 100 thereby forming an enlarged image thereon.

In the liquid crystal devices 962R, 962G, and 962B of the present embodiment, light blocking layers are formed below the transistors so as to block reflected light coming from the projection optical system in the liquid crystal projector, light which is reflected from the surface of the device substrate when the projection light is passed through, a returning light ray which occurs when a part of the light ray output from one of the other liquid crystal devices leaks through the projection optical system, thereby shielding the channels of the respective pixel transistors from those light rays.

Thus, it is possible to use the color mixing prism 910 of the type suitable for miniaturization, without having to dispose additional films for blocking the returning light between the color mixing prism 910 and the respective liquid crystal devices 962R, 962G, and 962B, or without having to form the polarizer means so that they have the capability of blocking the returning light. Therefore, it is possible to realize a liquid crystal projector in a simple and small form.

In the present embodiment, because the effects of the returning light upon the channel regions of transistors are suppressed, it is not required that polarizer means 961R, 961G, and 961B having the capability of blocking the returning light be directly bonded to the corresponding liquid crystal devices. Thus, it is possible to dispose those polarizer means at locations apart from the liquid crystal devices. More specifically, as shown in FIG. 9, the polarizer means 961R, 961G, and 961B may be bonded to the color mixing prism 910, and the other polarizer means 960R, 960G, and 960B may be bonded to the condenser lenses 951, 952, and 953, respectively. If the polarizer means are bonded to the color mixing prism 910 or to the condenser lenses 951, 952, and 953, heat in the polarizer means is absorbed by the color mixing prism 910 or the condenser lenses 951, 952, and 953, and thus the rise in temperature of the liquid crystal devices is suppressed. This allows the liquid crystal devise to correctly operate without generating an error.

Although not shown in the figure, if the liquid crystal devices are disposed so as to be spaced from the respective polarizer means, air layers are formed between the liquid crystal devices and the respective polarizer means. Thus, it is possible to feed cooling air into the spaces between the liquid crystal devices and the polarizer means, thereby further reducing the rise in temperature of the liquid crystal devices, and thus ensuring that the liquid crystal devices are prevented from operating erroneously owing to the temperature increase.

Although the electrooptical device according to the present invention has been described above with reference to the liquid crystal device, the invention is not limited to the liquid crystal device. The invention may also be applied to various other electrooptical devices such as an electroluminescence display and a plasma display.

In the present invention, as described above, defects in particular regions where the defect density is higher than the channel region serve as carrier recombination centers, thereby avoiding accumulation of excess carriers, and thus suppressing the floating substrate effects.

What is claimed is:

1. An electrooptical device comprising:
    a substrate including:
        a base substrate;
        a first insulating layer formed on said base substrate; and
        a semiconductor layer formed on said first insulating layer;
    said electrooptical device further comprising the following elements formed on said substrate:
        a plurality of scanning lines;
        a plurality of data lines extending so as to cross said plurality of scanning lines;
        pixel transistors each arranged to correspond to the cross of said plurality of scanning lines and said plurality of data lines; and
        a peripheral circuit including a driving transistor for driving said pixel transistors;
        said electrooptical device including a pixel transistor or a driving transistor in which regions having a higher defect density than a channel region are formed on both sides of the channel region to include lightly doped drain regions.

2. The electrooptical device according to claim 1, wherein said pixel transistors are p-channel transistors.

3. The electrooptical device according to claim 2, wherein said semiconductor layer formed on said first insulating layer has a thickness equal to or less than 100 nm, at least at locations where said pixel transistors each connected to one of said plurality of scanning lines and also to one of said plurality of data lines are formed.

4. The electrooptical device according to claim 1, wherein defects in said region are produced by implanting Ar ions into said region.

5. The electrooptical device according to claim 1, wherein said base substrate is single-crystal silicon.

6. The electrooptical device according to claim 1, wherein said base substrate is quartz and the semiconductor layer formed on the first insulating layer is single-crystal silicon.

7. The electrooptical device according to claim 1, wherein said base substrate is quartz and the semiconductor layer formed on the first insulating layer is polycrystalline silicon.

8. The electrooptical device according to claim 1, wherein said base substrate is glass.

9. An electronic device comprising:
    a light source;
    an electrooptical device according to claim 1, for modulating light, which falls upon said electrooptical device after being emitted from said light source, in accordance with image information; and
    projection means for projecting the light modulated by said electrooptical device.

10. An electrooptical device comprising:
    a substrate including:
        a base substrate;
        a first insulating layer formed on said base substrate; and
        a semiconductor layer formed on said first insulating layer;
    said electrooptical device further comprising the following elements formed on said substrate:
        a plurality of scanning lines;
        a plurality of data lines extending so as to cross said plurality of scanning lines;
        pixel transistors each arranged to correspond to the cross of said plurality of scanning lines and said plurality of data lines; and
        a peripheral circuit including a driving transistor for driving said pixel transistors,
        said electrooptical device including a pixel transistor or a driving transistor in which regions having a higher defect density than a channel region are formed to include lightly doped drain regions that are formed on both sides of the channel region, and in a same region as a source region that is formed on one side of the channel region.

11. An electrooptical device comprising:
a substrate including:
   a base substrate;
   a first insulating layer formed on said base substrate; and
   a semiconductor layer formed on said first insulating layer;
   said electrooptical device further comprising the following elements formed on said substrate:
      a plurality of scanning lines;
      a plurality of data lines extending so as to cross said plurality of scanning lines; and
      pixel transistors each arranged to correspond to the cross of said plurality of scanning lines and said plurality of data lines,
      said pixel transistors being formed such that regions having a higher defect density than a channel region are formed on both sides of the channel region to include lightly doped drain regions.

12. An electrooptical device comprising:
a substrate including:
   a base substrate;
   a first insulating layer formed on said base substrate; and
   a semiconductor layer formed on said first insulating layer;
   said electrooptical device further comprising the following elements formed on said substrate:
      a plurality of scanning lines;
      a plurality of data lines extending so as to cross said plurality of scanning lines;
      pixel transistors each arranged to correspond to the cross of said plurality of scanning lines and said plurality of data lines; and
      said pixel transistors being formed such that regions having a higher defect density than a channel region are formed to include lightly doped drain regions that are formed on both sides of the channel region, and in a same region as a source region that is formed on one side of the channel region.

13. An electrooptical device comprising:
a substrate including:
   a base substrate;
   a first insulating layer formed on said base substrate; and
   a semiconductor layer formed on said first insulating layer;
   said electrooptical device further comprising the following elements formed on said substrate:
      a plurality of scanning lines;
      a plurality of data lines extending so as to cross said plurality of scanning lines;
      pixel transistors each arranged to correspond to the cross of said plurality of scanning lines and said plurality of data lines; and
      a peripheral circuit including a driving transistor for driving said pixel transistors,
      said electrooptical device including a pixel transistor or a driving transistor in which regions having a higher defect density than a channel region are formed to include lightly doped drain regions that are formed on both sides of the channel region, and in a same drain region that is formed on one side of the channel region.

14. An electrooptical device comprising:
a substrate including:
   a base substrate;
   a first insulating layer formed on said base substrate; and
   a semiconductor layer formed on said first insulating layer;
   said electrooptical device further comprising the following elements formed on said substrate:
      a plurality of scanning lines;
      a plurality of data lines extending so as to cross said plurality of scanning lines;
      pixel transistors each arranged to correspond to the cross of said plurality of scanning lines and said plurality of data lines; and
      said pixel transistors being formed such that regions having a higher defect density than a channel region are formed to include lightly doped drain regions that are formed on both sides of the channel region, and in a same region as a drain region that is formed on one side of the channel region.

* * * * *